United States Patent [19]
Erdal et al.

[11] Patent Number: 5,570,045
[45] Date of Patent: Oct. 29, 1996

[54] HIERARCHICAL CLOCK DISTRIBUTION SYSTEM AND METHOD

[75] Inventors: Apo C. Erdal, Saratoga; Trung Nguyen, San Jose; Kwok M. Yue, Fremont, all of Calif.

[73] Assignee: LSI Logic Corporation, Milpitas, Calif.

[21] Appl. No.: 482,763

[22] Filed: Jun. 7, 1995

[51] Int. Cl.$^6$ .................................................. H03K 19/00
[52] U.S. Cl. ............................ 326/93; 327/297; 327/293; 326/101
[58] Field of Search ...................... 326/93, 101; 327/165, 327/166, 293, 295, 297

[56] References Cited

U.S. PATENT DOCUMENTS

| | | | |
|---|---|---|---|
| 3,104,330 | 9/1963 | Hamilton | 327/297 |
| 4,769,558 | 9/1988 | Bach | 327/297 |
| 4,812,684 | 3/1989 | Yamagiwa et al. | 326/101 |
| 4,912,340 | 3/1990 | Wilcox et al. | 307/269 |
| 4,926,066 | 5/1990 | Maini et al. | 326/101 |
| 5,140,184 | 8/1992 | Hamamoto et al. | 326/93 |
| 5,172,330 | 12/1992 | Watanabe et al. | 327/297 |
| 5,204,559 | 4/1993 | Deyhimy et al. | 307/480 |
| 5,206,861 | 4/1993 | Hannon et al. | 371/22.3 |
| 5,239,215 | 8/1993 | Yamaguchi | 307/480 |
| 5,254,955 | 10/1993 | Saeki et al. | 328/155 |
| 5,258,660 | 11/1993 | Nelson et al. | 307/269 |
| 5,278,466 | 1/1994 | Honoa et al. | 307/480 |
| 5,307,381 | 4/1994 | Ahuja | 375/107 |
| 5,309,035 | 5/1994 | Watson, Jr. et al. | 307/269 |
| 5,430,397 | 7/1995 | Itoh et al. | 327/297 |

Primary Examiner—Edward P. Westin
Assistant Examiner—Richard Roseen
Attorney, Agent, or Firm—Poms, Smith, Lande & Rose

[57] ABSTRACT

A microelectronic circuit includes a plurality of circuitry blocks and sub-blocks, a clock driver, an electrical interconnect that directly connects the clock driver to the sub-blocks, and balanced clock-tree distribution systems provided between the electrical interconnect and circuitry in the sub-blocks respectively. A method of producing a hierarchial clock distribution system for the circuit includes determining clock skews between the clock driver and the sub-blocks respectively. Delay buffers are selected from a predetermined set of delay buffers having the same physical size and different delays, with the delay buffers being selected to provide equal clock skews between the clock driver and the distribution systems respectively. Each delay buffer includes a delay line, and a number of loading elements that are connected to the delay line, with the number of loading elements being selected to provide the required clock delay for the respective sub-block.

13 Claims, 3 Drawing Sheets

HIERARCHICAL CLOCK DISTRIBUTION SYSTEM AND METHOD

BACKGROUND OF THE INVENTION

1. Field of the Invention

The present invention generally relates to the art of microelectronic integrated circuits, and more specifically to a hierarchial clock distribution system and method for optimally equalizing clock skew to circuitry in blocks of an integrated circuit.

2. Description of the Related Art

A large microelectronic integrated circuit, such as an Application Specific Integrated Circuit (ASIC), generally includes a number of circuitry blocks or modules that can themselves include sub-blocks in a hierarchial arrangement. The circuitry is driven by clock pulses that are applied through an input clock driver and distributed via interconnect wiring to the various blocks of the circuit and other devices that are not included in the blocks.

In order for the circuit to function properly, the clock pulses must arrive at each clocked circuit element at the same time. However, the lengths of the wiring that conduct the clock pulses to the different blocks will generally be different. Since the length of time required for an electrical signal to propagate through a wire is proportional to the length of the wire, the clock pulses will arrive at the blocks at different times.

In addition, different types of buffers may be used in each block, creating differences between the clock pulse arrival to the clocked circuit elements in the blocks. The phase or timing difference between the clock pulse arrival time to any two clocked circuit element in a microelectronic integrated circuit is called skew.

It is therefore necessary to provide means for minimizing the skew in the circuit and restore synchronism to the operation of the circuit. This function can be provided by inserting delay buffers in the circuit having different delays to compensate for the different values of delay at the individual blocks.

A typical prior art skew compensation system is disclosed in U.S. Pat. No. 5,307,381, entitled "SKEW-FREE CLOCK SIGNAL DISTRIBUTION NETWORK IN A MICROPROCESSOR", issued Apr. 26, 1994 to B. Ahuja. A simplified diagram illustrating this system is presented in FIG. 1.

Input clock pulses CLOCK are applied to a plurality of delay buffers 10, 12 and 14, which are connected through lines 16, 18 and 20 to circuit blocks 22, 24 and 26 respectively. The buffers 10, 12 and 14 delay the clock pulses by different lengths of time to compensate for the different lengths of the lines 16, 18 and 20 such that the clock pulses CLOCK arrive at the blocks 22, 24 and 26 simultaneously.

An extension of this concept to a hierarchial structure of circuitry blocks is disclosed in U.S. Pat. No. 5,258,660, entitled "SKEW-COMPENSATED CLOCK DISTRIBUTION SYSTEM", issued Nov. 2, 1993 to S. Nelson et al. A simplified diagram of this system is presented in FIG. 2.

The system comprises a plurality of fanout circuits 30, 32, 34, 36 and 38, each including an input delay buffer and a plurality of output delay buffers which are collectively designated by the reference character B. As illustrated, each fanout circuit has three outputs, although the actual number of outputs is not relevant.

The output delay buffers B of the fanout circuit 30 are connected to the input delay buffers B of the fanout circuits 32, 34 and 36, which collectively produce nine outputs. Each output of the fanout circuits 32, 34 and 36 is connected to an input of another fanout circuit to provide a total of 27 outputs, and the hierarchial chain can continue to as many levels as desired. Only one fanout circuit 38 is illustrated as being connected to an output buffer B of the fanout circuit 32 for simplicity of illustration.

The output buffers of the fanout circuits are connected to respective circuit blocks of a microelectronic integrated circuit, although not explicitly illustrated, in the manner described above with reference to FIG. 1. Thus, the skew from the clock input to the blocks can be equalized.

However, it is difficult to predetermine and accurately equalize skew using fixed delay buffers in the arrangement of FIG. 2 because any inaccuracy is passed to downstream fanout circuits in the chain. For this reason, the buffers B are implemented as programmable delay elements such as illustrated in FIG. 3.

Each delay buffer B includes a chain of cascaded fixed delay elements 42, 44, 46 and 48 having outputs connected to inputs of a multiplexer 50. The delay at the output of each delay element is equal to the delay that itself produces plus the accumulated delay of the upstream delay elements. The output of the delay element 42 has a minimum delay value, whereas the output of the delay element 48 has a maximum delay value.

Although not explicitly illustrated, the system comprises a phase locked loop or other type of phase comparator that compares reference clock pulses having the required skew with output pulses CLOCK' from the multiplexer 50 of each buffer B. The comparator then generates and applies a unique SELECT signal to the multiplexer 50 of each buffer B designating which multiplexer input (output of respective delay element 42, 44, 46 or 48) to pass therethrough as output pulses CLOCK'. The value of the SELECT signal corresponds to the delay required to make the phase or skew of the pulses CLOCK' coincide with that of the reference pulses.

Although effective in equalizing the skew in an integrated circuit having a hierarchial block structure, the arrangement of FIGS. 1 to 3 is disadvantageous in that it requires programmable delay buffers and phase comparison circuitry. This undesirably increases the complexity and cost of the integrated circuit.

SUMMARY OF THE INVENTION

It is an object of the present invention to provide a hierarchial clock distribution system and method for a microelectronic integrated circuit that enables accurate clock delay compensation using fixed delay buffers to minimize the skew.

A microelectronic circuit includes a plurality of circuitry blocks and sub-blocks, a clock driver, an electrical interconnect that directly connects the clock driver to the sub-blocks, and balanced clock-tree distribution systems provided between the electrical interconnect and circuitry in the sub-blocks respectively.

A method of providing a hierarchial clock distribution system for the circuit includes determining clock delays between the clock driver and the clocked circuit elements within sub-blocks respectively. Delay buffers are selected from a predetermined set of fixed delay buffers having the same physical size and different delays, with the delay buffers being selected to provide equal clock delay between the clock driver and the distribution systems respectively.

Each delay buffer includes a delay line, and a number of loading elements that are connected to the delay line, with the number of loading elements being selected to provide the required clock delay for the respective sub-block.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 4:
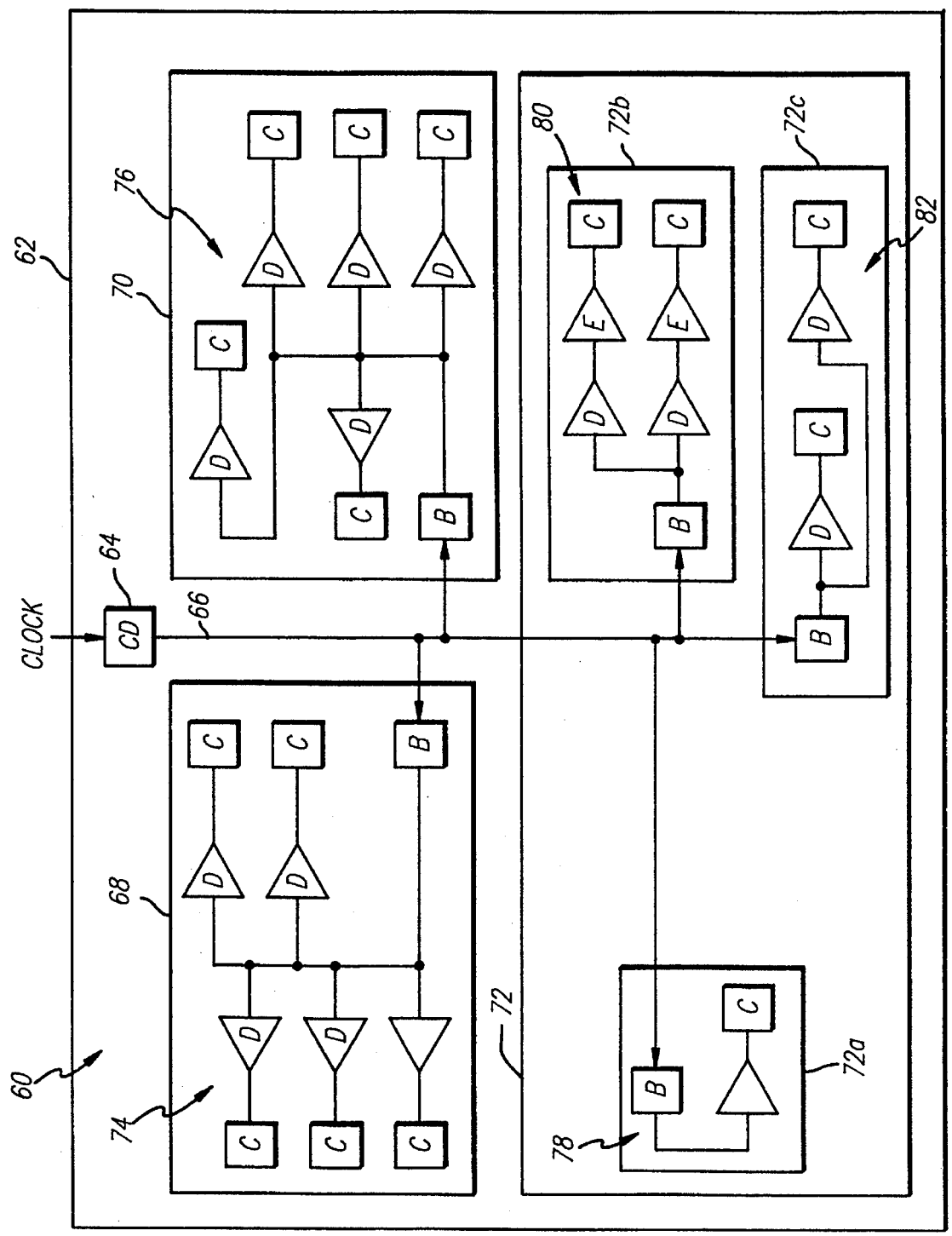
FIG. 4 is a diagram illustrating a microelectronic integrated circuit including a hierarchial clock distribution system embodying the present invention.

A hierarchial clock distribution system embodying the present invention is illustrated in FIG. 4 and generally designated by the reference numeral 60. The system 60 is implemented as part of a microelectronic integrated circuit 62 which typically receives clock pulses CLOCK from an external source. However, it is within the scope of the invention, although not explicitly illustrated, to provide a clock pulse generator as part of the circuit 62 itself.

The clock pulses CLOCK are applied to a clock driver 64, which applies the clock pulses through an electrical interconnect wiring 66 to microelectronic circuit modules or blocks 68, 70 and 72. The block 72 comprises sub-blocks 72a, 72b and 72c.

The wiring 66 is connected to a clock delay buffer B in each block 68 and 70, and in each sub-block 72a, 72b and 72c. It will be noted that no buffer B is provided in the block 72 between the wiring 66 and the sub-blocks 72a, 72b and 72c.

Although only two levels of hierarchy are illustrated in FIG. 4, consisting of one block level and one sub-block level, the invention is not so limited. A hierarchial structure including any number of block/sub-block levels can be provided in accordance with the present invention. However, a delay buffer B will be provided typically at the first and second hierarchial block level.

The individual time delays provided by the delay buffers B are selected to equalize the clock delay between the driver 64 and clocked circuit elements or cells C in each block. Skew compensation within the blocks or sub-blocks 68, 70, 72a, 72b and 72c is provided by balanced clock tree distribution systems 74, 76, 78, 80 and 82 respectively.

The specific arrangement of each distribution system will depend on the circuitry in the respective block or sub-block. For simplicity of illustration, each balanced clock tree distribution system 74, 76, 78, 80 and 82 is shown as comprising the clocked circuitry elements or cells C, and local buffers or drivers D and E that are connected between the buffers B and the cells C.

Balanced clock tree distribution is known in the art per se, and the details thereof are not the particular subject matter of the present invention. A basic treatise on this subject is presented in an article entitled "AN IMPLEMENTATION OF A CLOCK-TREE DISTRIBUTION SCHEME FOR HIGH-PERFORMANCE ASICS", by A. Erdal et al, in Proceedings of the Annual IEEE International ASIC Conference and Exhibit, Rochester, N.Y., Sept. 1992, pp. 26 to 29.

In general, balanced clock tree distribution is performed by using a clock partition to split the original clock net into buffered sub-clock nets in a bottom-up fashion after placement of the cells C, without the local buffers D. An initial grouping of clocked cells C (cells having clock pins) is obtained according to the spread of the cells C and the distance among the neighboring clocked cells C. Then, the clocked cells C are exchanged among the groups to get the optimum result.

The objective is to minimize both the maximum absolute loading difference among the groups and the standard deviation of the loading of the groups. After the grouping, an appropriate number of balance cells (not shown) are added to balance the loading for each group.

The location of each balance cell is calculated to balance the area and spread of the group with respect to other groups. The location of the local buffers D and E are calculated as the optimum balance center, based on the estimated routing pattern of the group to minimize the skew among the clocked cells C. Finally, all the balance cells and buffers D and E are inserted into the design and placed automatically in layout, based on the calculated coordinates.

Figure 1:
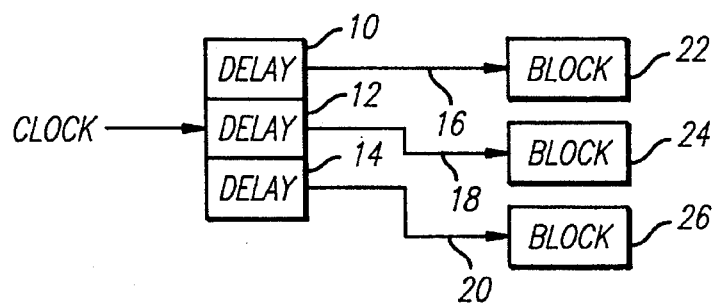
FIG. 1 is a simplified diagram illustrating a prior art system for clock skew equalization.
Figure 2:
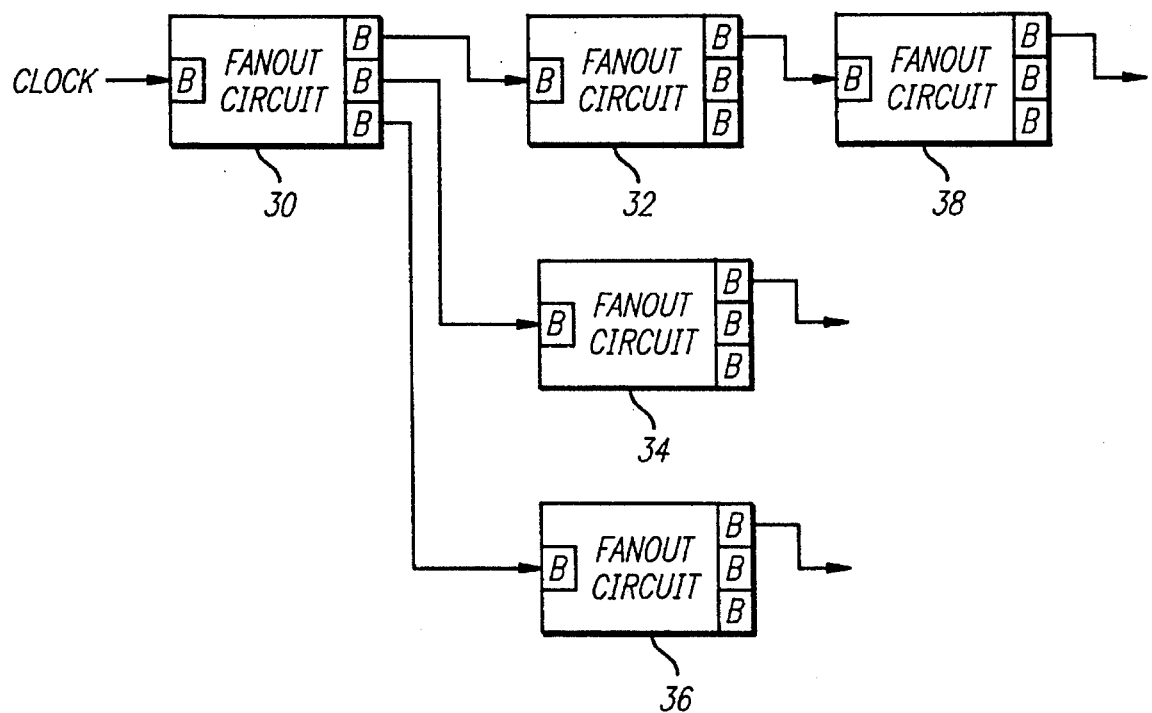
FIG. 2 is a simplified diagram illustrating how the system of FIG. 1 can be extended to a hierarchial circuitry block arrangement.
Figure 3:
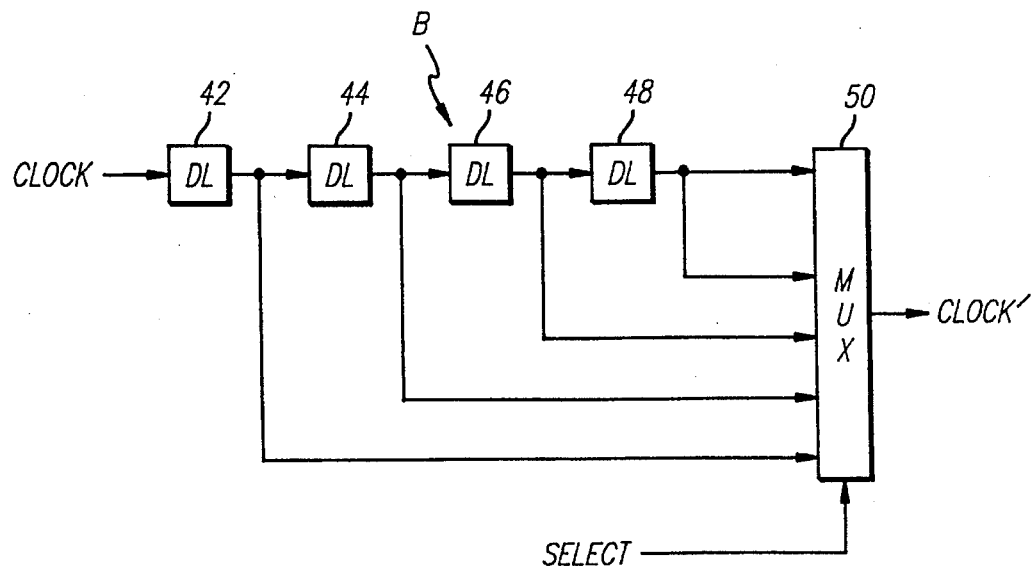
FIG. 3 is a diagram illustrating a programmable delay buffer of the system of FIG. 2.

The present invention enables effective clock skew compensation using fixed delay buffers B, which is difficult to obtain using the prior art arrangements illustrated in FIGS. 1, 2 and 3. The invention accomplishes this goal by providing the delay buffers B only at one sub-block level, thereby eliminating accumulated hierarchial delay inaccuracies, and performing block level skew compensation using the balanced clock tree distribution systems.

Figure 5:
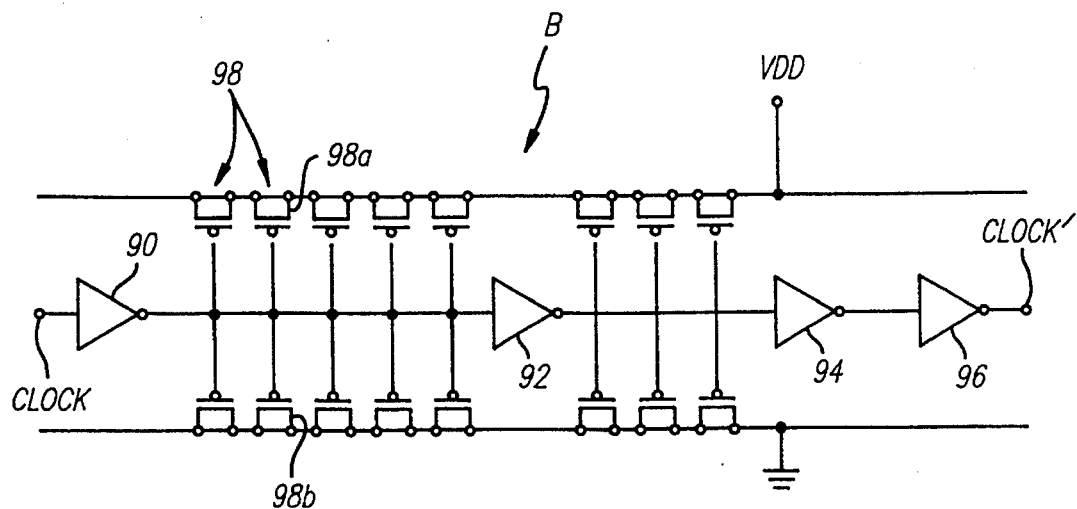
FIG. 5 is an electrical schematic diagram illustrating a fixed clock delay buffer of the system of FIG. 4.

As illustrated in FIG. 5, each delay buffer B has the same physical size in order to facilitate placement in the circuit 62. Each buffer B comprises the same number, here illustrated as four, of logic elements which provide known delays. As shown in FIG. 5, the logic elements are inverters 90, 92, 94 and 96, although the invention is not so limited. The inverters can be replaced by, for example, NOR gates or wire delay lines, although not explicitly illustrated.

The inverters 90, 92, 94 and 96 are connected in a cascade or chain, such that the clock pulses CLOCK' are delayed by the sum of the delays provided by the individual inverters 90, 92, 94 and 96. For example, each inverter provides a delay of 0.25 ns, such that the total delay provided by the inverters 90, 92, 94 and 96 alone is 1.0 ns.

Each delay buffer B is capable of providing a delay ranging from 1.0 ns to, for example 3.0 ns, by variably loading the outputs of the inverters 90, 92, 94 and 96 using loading elements 98. Each loading element 98 comprises, in the illustrated example, a PMOS field-effect transistor 98a and/or an NMOS field-effect transistor 98b that have their gates connected to the output of the respective inverter. The source and drain of each transistor 98a is connected to a first constant electrical potential source VDD, whereas the source and drain of each transistor 98b are connected to a second constant electrical potential source which is illustrated as being ground.

Each loading element 98 causes the delay of the respective inverter 90, 92, 94 and 96 to be increased by, for example, 0.1 ns. A number of delay elements 98 from 0 to 5 can be connected to the output of each inverter 90, 92, 94 and 96, such that the total delay can be increased by 4 inverters×5 loading elements/inverter×0.1 ns delay/loading element=2.0 ns. Thus, the total maximum delay that can be provided by each delay buffer B is 1.0 ns+2.0 ns=3.0 ns, and the delay can be varied from 1.0 ns to 3.0 ns in 20 increments of 0.1 ns/increment.

In configuring a particular buffer B, loading elements 98 are first provided at the output of the first inverter 90. If more loading elements 98 are required, they are provided at the outputs of the inverters 92, 94 and 96 in consecutive order.

The design of the integrated circuit 62 is facilitated by providing a circuit library set of 20 delay buffers 98 which differ from each other only in that they have 20 different numbers of loading elements 98 to provide the 20 different values of delay respectively.

A timing analysis is performed on the circuit 62 to determine the value of delay between the clock driver 64 and each clocked cell C. This is accomplished by assigning initially a minimum delay value (1.0 ns) to each delay buffer B, and determining the delay at the input pin of clocked cell C. The timing analysis can be advantageously performed using, for example, the Timing Analyzer Release 2.2 which is commercially available as part of the Concurrent MDE® Design System (C-MDE® Design System) from LSI Logic Corporation of Milpitas, Calif.

After the delay corresponding to each clocked cell C is determined, the value of delay which the buffer B is required to produce in order to equalize the delay at the inputs of all of the clocked cells C is calculated, and one of the 20 possible buffer configurations is selected from the library set which has the corresponding value of delay. The buffers B are then inserted into the design and placed automatically in layout, based on the required delay values.

Various modifications will become possible for those skilled in the art after receiving the teachings of the present disclosure without departing from the scope thereof.

For example, the numbers of delay elements and loading elements in the buffers B as described above, as well as the specific delays that they provide, are exemplary only, and can be varied in any manner to accommodate a particular application.

We claim:

1. A hierarchial clock distribution system for a microelectronic circuit including a plurality of circuitry blocks and sub-blocks, comprising:

a clock driver;

delay buffers provided in the sub-blocks respectively;

an electrical interconnect that directly connects the clock driver to the delay buffers; and balanced clock-tree distribution systems provided between the delay buffers and circuitry in the sub-blocks respectively;

the delay buffers providing equal clock skews from the clock driver to the distribution systems respectively, in which:

the delay buffers have the same physical size, and comprise identical delay lines that are loaded to equalize said clock skews respectively.

2. A system as in claim 1, in which the delay lines are loaded by numbers of loading elements that equalize said clock skews respectively.

3. A system as in claim 2, in which:

the delay lines comprise strings of logic elements; and the loading elements are connected to outputs of the logic elements.

4. A system as in claim 3, in which the logic elements comprises inverters.

5. A system as in claim 3, in which the loading elements comprise field-effect transistors having gates connected to outputs of the logic elements, and sources and drains connected to a constant electrical potential.

6. A system as in claim 3, in which each loading element comprises:

a PMOS field-effect transistor having a gate connected to an output of one of the logic elements, and a source and a drain connected to a first constant electrical potential; and an NMOS field-effect transistor having a gate connected to an output of said one of said logic elements, and a source and a drain connected to a second constant electrical potential that is negative relative to the first constant electrical potential.

7. A system as in claim 3, in which each logic element has a number n of loading elements connected to the output thereof, where $0 \leq n \leq N$, and N is a predetermined maximum value.

8. A clock delay buffer for a microelectronic circuit, comprising:

a delay line; and a number of loading elements that are connected to the delay line, said number being selected to provide a predetermined clock delay, in which:

the delay line comprises a string of logic elements;

the loading elements are connected to outputs of the logic elements; and the loading elements comprise field-effect transistors having gates connected to outputs of the logic elements, and sources and drains connected to a constant electrical potential.

9. A clock delay buffer for a microelectronic circuit, comprising:

a delay line; and a number of loading elements that are connected to the delay line, said number being selected to provide a predetermined clock delay, in which:

the delay line comprises a string of logic elements;

the loading elements are connected to outputs of the logic elements; and each loading element comprises:

a PMOS field-effect transistor having a gate connected to an output of one of the logic elements, and a source and a drain connected to a first constant electrical potential; and an NMOS field-effect transistor having a gate connected to an output of said one of said logic elements, and a source and a drain connected to a second constant electrical potential that is negative relative to the first constant electrical potential.

10. A clock delay buffer for a microelectronic circuit, comprising:

a delay line; and a number of loading elements that are connected to the delay line, said number being selected to provide a predetermined clock delay, in which:

the delay line comprises a string of logic elements;

the loading elements are connected to outputs of the logic elements; and each logic element has a number n of loading elements connected to the output thereof, where $0 \leq n \leq N$, and N is a predetermined maximum value.

11. A method of producing a hierarchial clock distribution system for a microelectronic circuit, in which:

the microelectronic circuit comprises:
- a plurality of circuitry blocks and sub-blocks:
- a clock driver;
- an electrical interconnect that directly connects the clock driver to the sub-blocks; and
- balanced clock-tree distribution systems provided between the electrical interconnect and circuitry in the sub-blocks respectively;

the method comprising the steps of:
- (a) determining clock skews between the clock driver and the sub-blocks respectively;
- (b) selecting delay buffers from a predetermined set of delay buffers having a same physical size and different delays, said selected delay buffers being selected to provide equal clock skews between the clock driver and the distribution systems respectively; and
- (c) inserting said selected delay buffers in the sub-blocks between the electrical interconnect and the distribution systems respectively.

12. A method of producing a hierarchial clock distribution system for a microelectronic circuit, in which:

the microelectronic circuit comprises:
- a plurality of circuitry blocks and sub-blocks:
- a clock driver;
- an electrical interconnect that directly connects the clock driver to the sub-blocks; and
- balanced clock-tree distribution systems provided between the electrical interconnect and circuitry in the sub-blocks respectively;

the method comprising the steps of:
- (a) determining clock skews between the clock driver and the sub-blocks respectively;
- (b) selecting delay buffers from a predetermined set of delay buffers having a same physical size and different delays, said selected delay buffers being selected to provide equal clock skews between the clock driver and the distribution systems respectively; and
- (c) inserting said selected delay buffers in the sub-blocks between the electrical interconnect and the distribution systems respectively, in which:

the delay buffers of said set comprise identical delay lines that are loaded differently to provide said different delays respectively; and step (b) comprises selecting said selected delay buffers in accordance with said loadings respectively.

13. A method of producing a hierarchial clock distribution system for a microelectronic circuit in which:

the microelectronic circuit comprises:
- a plurality of circuitry blocks and sub-blocks:
- a clock driver;
- an electrical interconnect that directly connects the clock driver to the sub-blocks; and
- balanced clock-tree distribution systems provided between the electrical interconnect and circuitry in the sub-blocks respectively;

the method comprising the steps of:
- (a) determining clock skews between the clock driver and the sub-blocks respectively;
- (b) selecting delay buffers from a predetermined set of delay buffers having a same physical size and different delays, said selected delay buffers being selected to provide equal clock skews between the clock driver and the distribution systems respectively; and
- (c) inserting said selected delay buffers in the sub-blocks between the electrical interconnect and the distribution systems respectively, in which:

step (a) comprises performing a timing analysis of the microelectronic circuit with the delay buffers all providing a minimum value of clock skew.

* * * * *

UNITED STATES PATENT AND TRADEMARK OFFICE
CERTIFICATE OF CORRECTION

PATENT NO. : 5,570,045
DATED : October 29, 1996
INVENTOR(S) : Erdal, et al

It is certified that error appears in the above-identified patent and that said Letters Patent is hereby corrected as shown below:

On the title page, item [22] should read -- [22] Filed: Jun. 7, 1995
(under 37 CFR 1.47) --

Signed and Sealed this

Twenty-first Day of July, 1998

Attest:

BRUCE LEHMAN

Attesting Officer  Commissioner of Patents and Trademarks